(12) United States Patent
Gudino et al.

(10) Patent No.: US 8,378,683 B2
(45) Date of Patent: Feb. 19, 2013

(54) HALL EFFECT CURRENT SENSOR

(76) Inventors: Natalia Gudino, Cleveland Heights, OH (US); Matthew J. Riffe, Cincinnati, OH (US); Jeremiah A. Heilman, University Heights, OH (US); Mark A. Griswold, Shaker Heights, OH (US)

( * ) Notice: Subject to any disclaimer, the term of this patent is extended or adjusted under 35 U.S.C. 154(b) by 508 days.

(21) Appl. No.: 12/750,091

(22) Filed: Mar. 30, 2010

(65) Prior Publication Data
US 2011/0241681 A1 Oct. 6, 2011

(51) Int. Cl.
*G01V 3/00* (2006.01)
(52) U.S. Cl. .......................................... 324/318; 324/309
(58) Field of Classification Search .......... 324/300–322; 600/407–445
See application file for complete search history.

(56) References Cited

U.S. PATENT DOCUMENTS 7,785,098 B1 * 8/2010 Appleby et al. ............... 425/470
8,049,193 B1 * 11/2011 Appleby et al. ............ 250/505.1

* cited by examiner

*Primary Examiner* — Brij Shrivastav
(74) *Attorney, Agent, or Firm* — J. T. Kalnay

(57) ABSTRACT

Example systems, apparatus, circuits, and so on described herein concern a Hall effect current sensor that includes a planar portion of a conductor that is oriented perpendicular to a base magnetic field in which it is located. In the presence of the magnetic field, a differential voltage is produced across the planar portion that is proportional to a strength of the magnetic field and the amount of current flowing through the conductor.

16 Claims, 7 Drawing Sheets

HALL EFFECT CURRENT SENSOR

BACKGROUND

In magnetic resonance imaging (MRI), transmit coils are used to generate a magnetic excitation field that is selectively applied to the patient in the presence of a base magnetic field. The magnetic excitation field may be in the form of radio frequency (RF) pulses or various other pulse waveforms. To generate the magnetic excitation field, current is passed through the transmit coil. The current in the transmit coil (or a related voltage) is typically closely controlled to produce a magnetic excitation field having the desired characteristics. The current (or voltage) associated with the transmit coil can be measured directly with traditional sensing methods. However, due to space constraints associated with the MRI apparatus as well as electrical interference from other MRI components, direct measurement of the current in the transmit coil may not be feasible. Indirect measurement of the current may result in inaccurate measurement because localized interference and coupling effects from adjacent coils may not be detected.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

DETAILED DESCRIPTION

Figure 1:
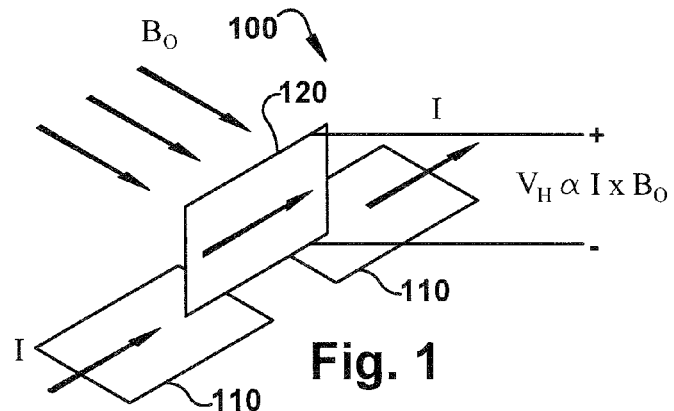
FIG. 1 is a schematic diagram of a Hall effect current sensor.

FIG. 1 illustrates a Hall effect sensor 100 that is configured to sense current flowing in a conductor 110 positioned within a magnetic field $B_0$. A planar portion 120 has been created in the conductor 110 to sense the amount of current flowing through the conductor 110 by exploiting the presence of the magnetic field $B_0$. The planar portion 120 is oriented substantially perpendicular to the magnetic field $B_0$. Due to the Hall effect, the magnetic field $B_0$ will cause the current flowing in the perpendicular planar portion 120 to be distributed unevenly across the planar portion 120. This uneven current distribution generates a differential voltage, $V_H$, across the planar portion 120 as depicted in FIG. 1. The voltage $V_H$ is proportional to the strength of the magnetic field $B_0$ and the current I. Thus, the current I in the presence of a known magnetic field $B_0$ may be determined by measuring the voltage $V_H$.

The Hall effect sensor implemented in the planar portion 120 may be useful, for example, in making an accurate determination of current flowing through a transmit or receive coil in the magnetic environment of an MRI apparatus. MRI transmit or receive coils may be designed to include a portion of the current path that is perpendicular to the magnetic field $B_0$.

Figure 2:
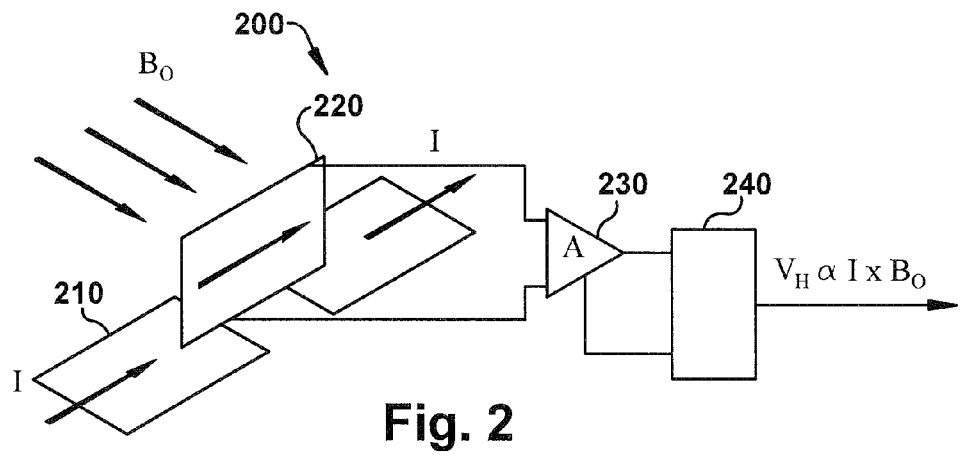
FIG. 2 is a schematic diagram of a Hall effect current sensor.

FIG. 2 illustrates a Hall effect sensor 200 that is configured to sense current flowing through a conductor 210. The Hall effect sensor 200 includes a planar portion 220, an amplifier 230, and a voltage sensor 240 that provides a signal that is indicative of the differential voltage $V_H$ sensed across the planar portion 220. The amplifier 230 amplifies $V_H$, which may be in the order of microvolts in typical MRI transmit coils, to facilitate processing by the voltage sensor 240. The voltage sensor 240 may include processing capabilities to output a signal indicative of the amount of current I flowing through the conductor 210 based on a given magnetic field $B_0$ strength.

Figure 3:
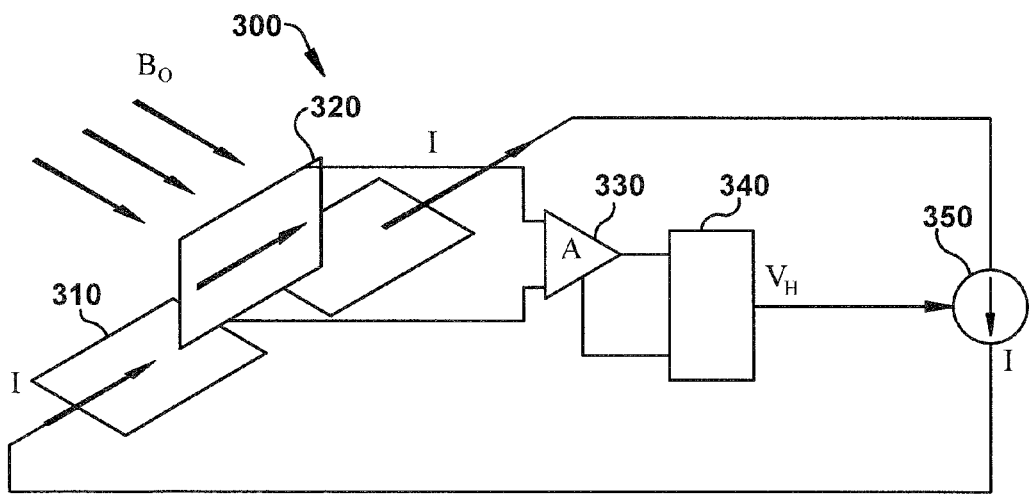
FIG. 3 is a schematic diagram of a Hall effect current sensor.

FIG. 3 illustrates a Hall effect sensor 300 that is used in a feedback control configuration with respect to current I flowing through a conductor 310. The Hall effect sensor 300 includes a planar portion 320 that is oriented substantially perpendicular to the orientation of the magnetic field $B_0$. The Hall effect sensor 300 also includes an amplifier 330 and voltage sensor 340 similar to the amplifier 230 and voltage sensor 240 in FIG. 2. In the feedback control configuration, the signal from the voltage sensor 340 is provided to a current source 350. The signal from the voltage sensor 340, which is indicative of the amount of current flowing through the conductor, is used as feedback by the current source 350 to control the current being provided by the source to the conductor 310. The feedback control configuration shown in FIG. 3 may be of particular use in an MRI environment where load characteristics may change during operation, causing corresponding undesired variations in the current I.

Figure 4:
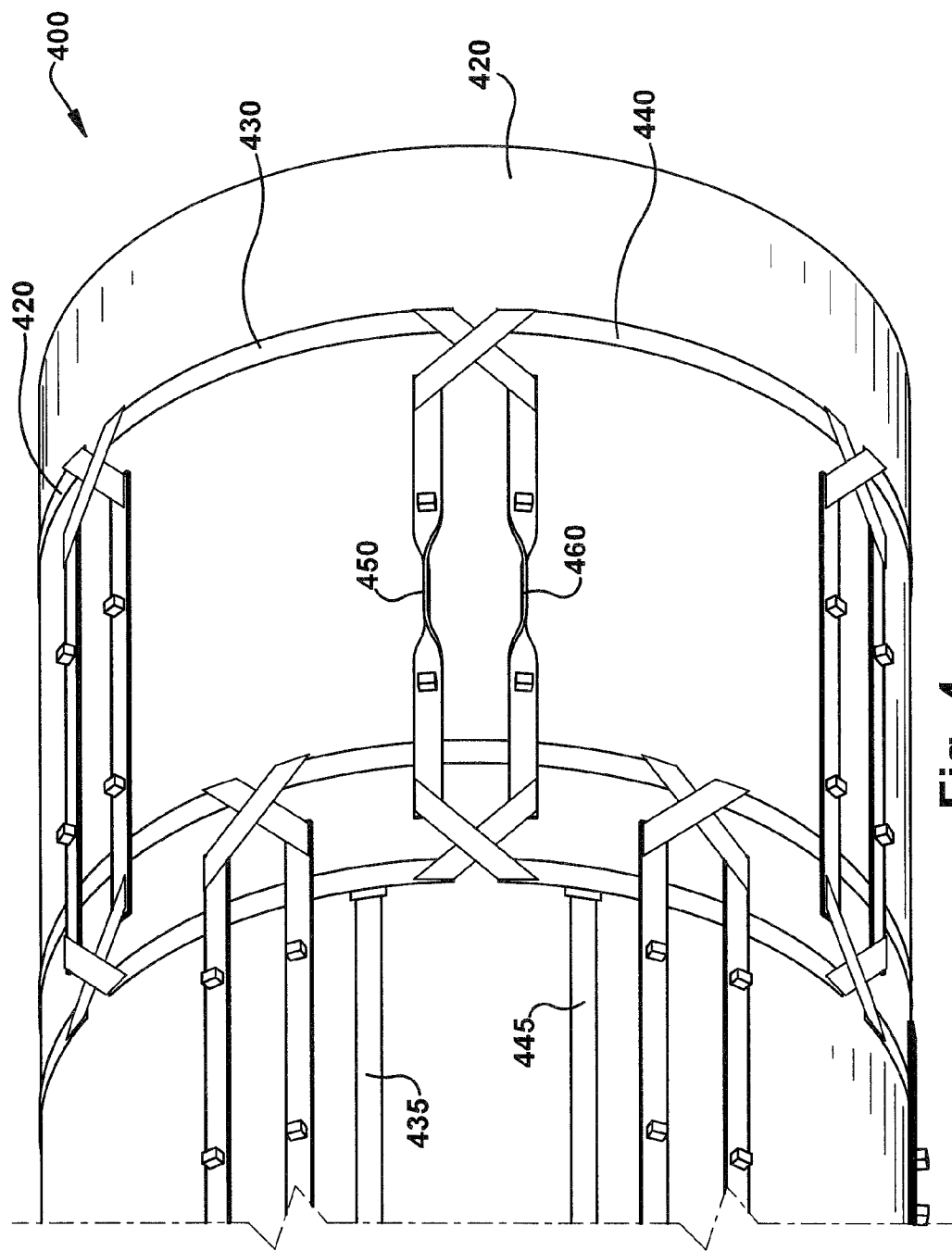
FIG. 4 illustrates a portion of an MRI apparatus having phased array transmit coils and Hall effect current sensors.

FIG. 4 illustrates a portion of an MRI apparatus 400 that includes transmit coils arranged in a phased array configuration. This type of transmit coil configuration is often used to implement a parallel MRI apparatus that includes multiple pairs of transmit and receive coils. The MRI apparatus 400 includes a non-conductive core 420 that defines an inner channel that surrounds the subject being imaged. An array of transmit coils (i.e., coils 420, 430, 440) are arranged around the outer surface of the core 420 in an overlapping manner. While only coils 420, 430, 440 will be discussed in particular, it is to be understood that the configuration described for these coils may be applied to all of the transmit coils in the phased array.

To generate RF magnetic excitation pulses within the core 420, RF current pulses are independently supplied to the coils 420, 430, 440 by associated cables 435, 445 (the cable for coil 420 is not shown). The transmit coils 420, 430, 440 are made up of thin strips of conductive material to reduce coupling effects between adjacent coils. The transmit coils 430, 440 include Hall effect sensors 450, 460 (the Hall effect sensor for coil 420 is not shown) that have been implemented by forming a portion of the thin strip coil conductor into a planar portion that is disposed perpendicular to the magnetic field $B_0$ that will be applied during MRI apparatus use. Associated amplifiers and sensors for the Hall effect sensors 450, 460 have not been shown for the sake of simplicity. While the Hall effect sensors 450, 460 are shown oriented approximately perpendicular to the core surface, it is to be understood that the particular orientation of each Hall effect sensor may be individually determined based on its particular position relative to the orientation of the base magnetic field $B_0$.

The Hall effect sensors illustrated in FIGS. 1-4 may provide significant benefit in a phased transmit coil array arrangement. This is because unlike receive arrays where the use of isolation preamplifiers can significantly reduce current on the array elements to reduce the effects of inductive coupling, transmit array coils produce an individually defined current. Mutual impedance between the coils changes the active impedance of a coil in proportion to the coil current. If this modulation is not taken into account, the desired current waveforms may not be achieved. Thus, the Hall effect sensor described herein may be used to accurately measure the current in a coil, independent of load changes, for feedback control purposes. Further, with appropriate shielding, the Hall effect sensor may reduce measurement errors caused by RF field coupling from other coils in the array. The precise current information provided by the Hall effect sensors could also be used to estimate local Specific Absorption Ratios (SARs) that quantify tissue heating due to RF power deposition.

Figure 5:
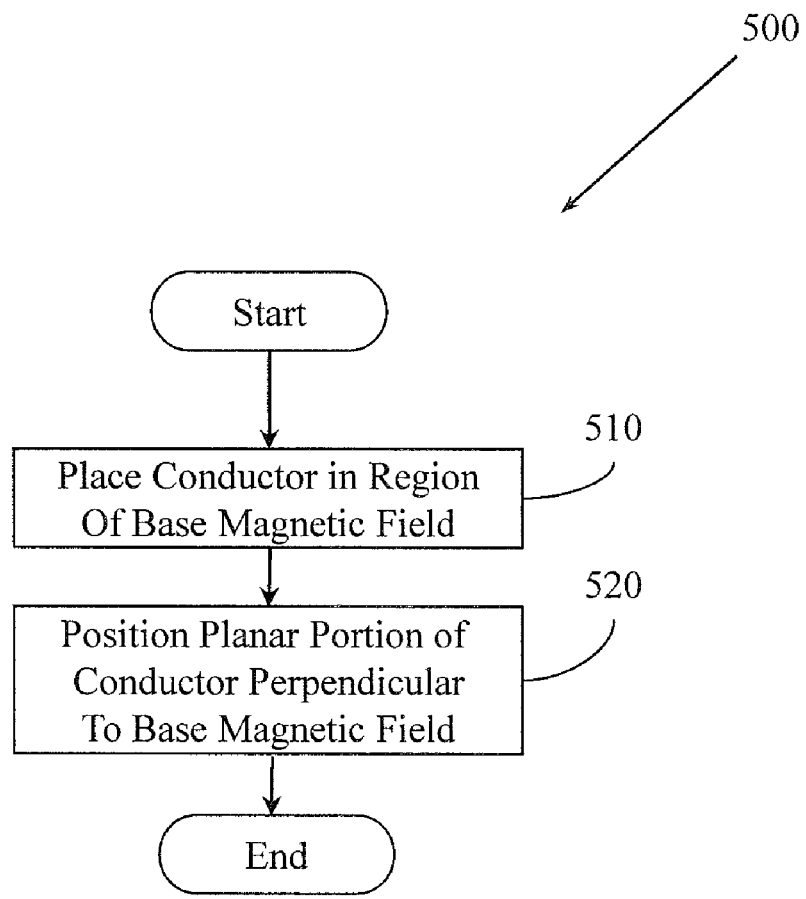
FIG. 5 illustrates a method associated with a Hall effect current sensor.

FIG. 5 illustrates a method 500 for implementing a Hall effect current sensor. The method 500 includes, at 510, placing a conductor that includes a planar portion in a region that is within a base magnetic field of an MRI apparatus when the MRI apparatus is in use. At 520, the conductor is oriented relative to the MRI apparatus such that the planar portion is disposed substantially perpendicular to an orientation of the base magnetic field produced when the MRI apparatus is in use. The method 500 may be performed by installing an MRI transmit coil that has a planar portion in an MRI apparatus such that the planar portion that will be substantially perpendicular to the base magnetic field of the MRI apparatus.

Figure 6:
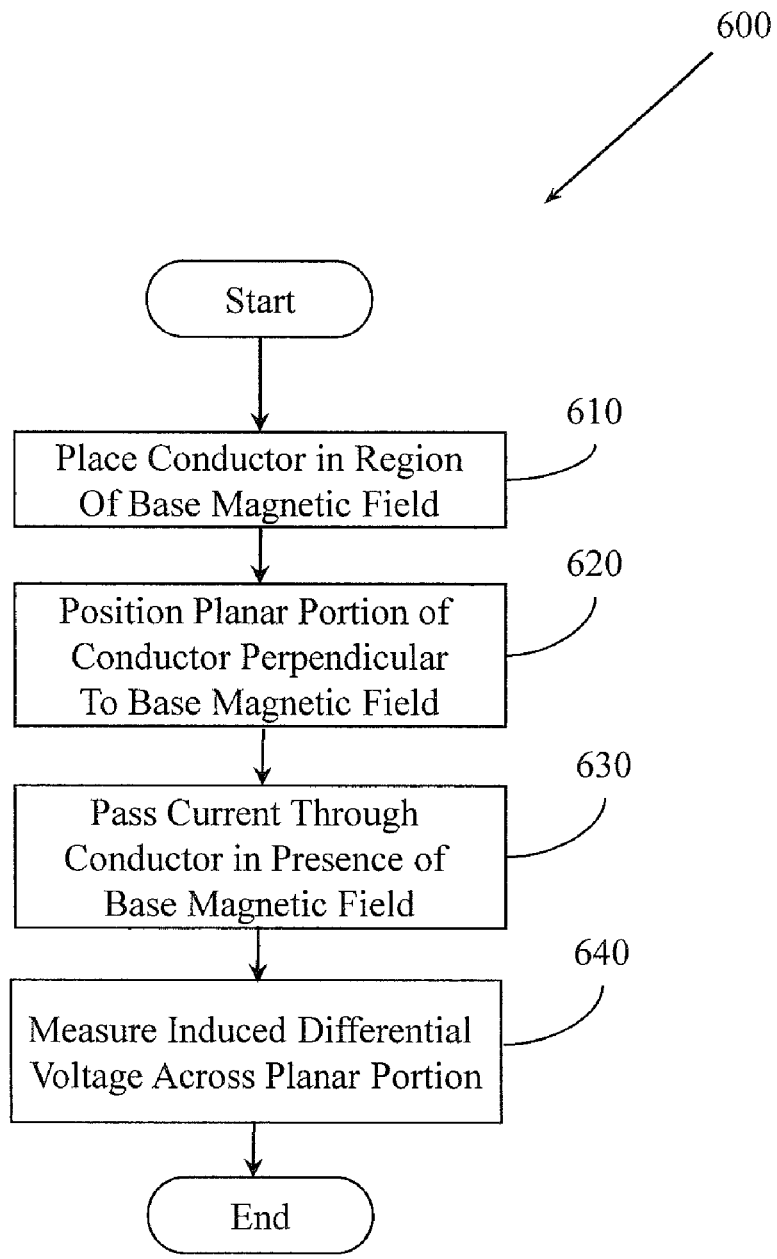
FIG. 6 illustrates a method associated with a Hall effect current sensor.

FIG. 6 illustrates a method 600 for implementing a Hall effect current sensor. The method 600 includes, at 610, placing a conductor that includes a planar portion in a region that is within a base magnetic field of an MRI apparatus when the MRI apparatus is in use. At 620, the conductor is oriented relative to the MRI apparatus such that the planar portion is disposed substantially perpendicular to an orientation of the base magnetic field produced when the MRI apparatus is in use. At 630, a magnetic field-inducing current is passed through the conductor in the presence of the base magnetic field. A differential voltage across the planar portion in a direction substantially perpendicular to the base field orientation is measured at 640. This measured voltage may be amplified or further processed to determine an amount of current flowing through the conductor.

Figure 7:
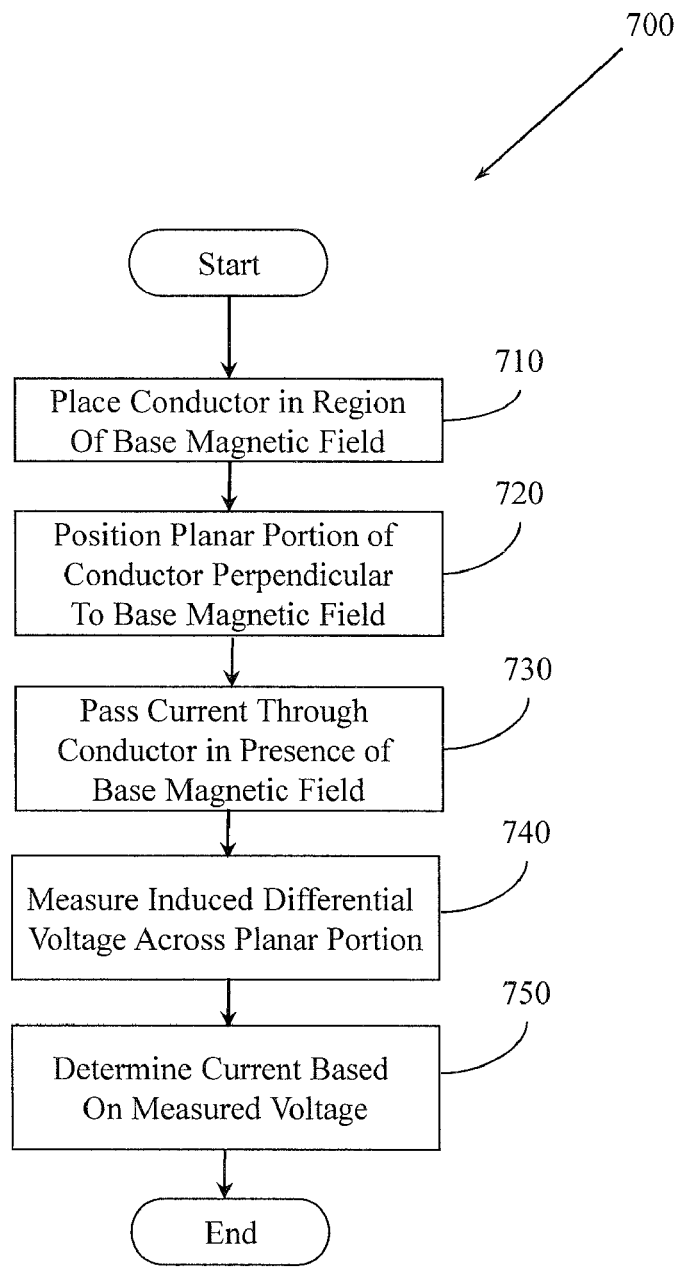
FIG. 7 illustrates a method associated with a Hall effect current sensor.

FIG. 7 illustrates a method 700 for implementing a Hall effect current sensor. The method 700 includes, at 710, placing a conductor that includes a planar portion in a region that is within a base magnetic field of an MRI apparatus when the MRI apparatus is in use. At 720, the conductor is oriented relative to the MRI apparatus such that the planar portion is disposed substantially perpendicular to an orientation of the base magnetic field produced when the MRI apparatus is in use. At 730, an RF magnetic field-inducing current is passed through the conductor in the presence of the base magnetic field. A differential voltage across the planar portion in a direction substantially perpendicular to the base field orientation is measured at 740. At 750, an amount of current flowing through the conductor is determined based, at least in part on the measured differential voltage.

Figure 8:
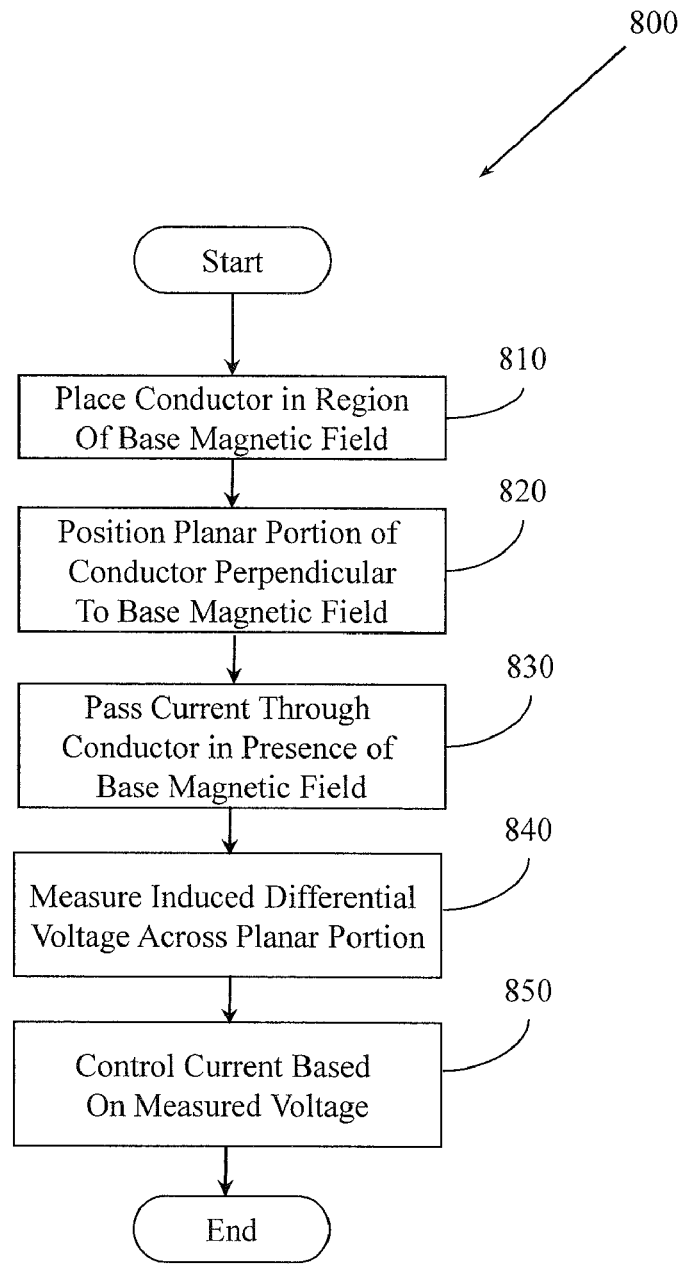
FIG. 8 illustrates a method associated with a Hall effect current sensor.

FIG. 8 illustrates a method 800 for implementing a Hall effect current sensor. The method 800 includes, at 810, placing a conductor that includes a planar portion in a region that is within a base magnetic field of an MRI apparatus when the MRI apparatus is in use. At 820, the conductor is oriented relative to the MRI apparatus such that the planar portion is disposed substantially perpendicular to an orientation of the base magnetic field produced when the MRI apparatus is in use. At 830, a magnetic field-inducing current is passed through the conductor in the presence of the base magnetic field. A differential voltage across the planar portion in a direction substantially perpendicular to the base field orientation is measured at 840. At 850, the passing of the RF magnetic field-inducing current is controlled based, at least in part, on the measured differential voltage.

Figure 9:
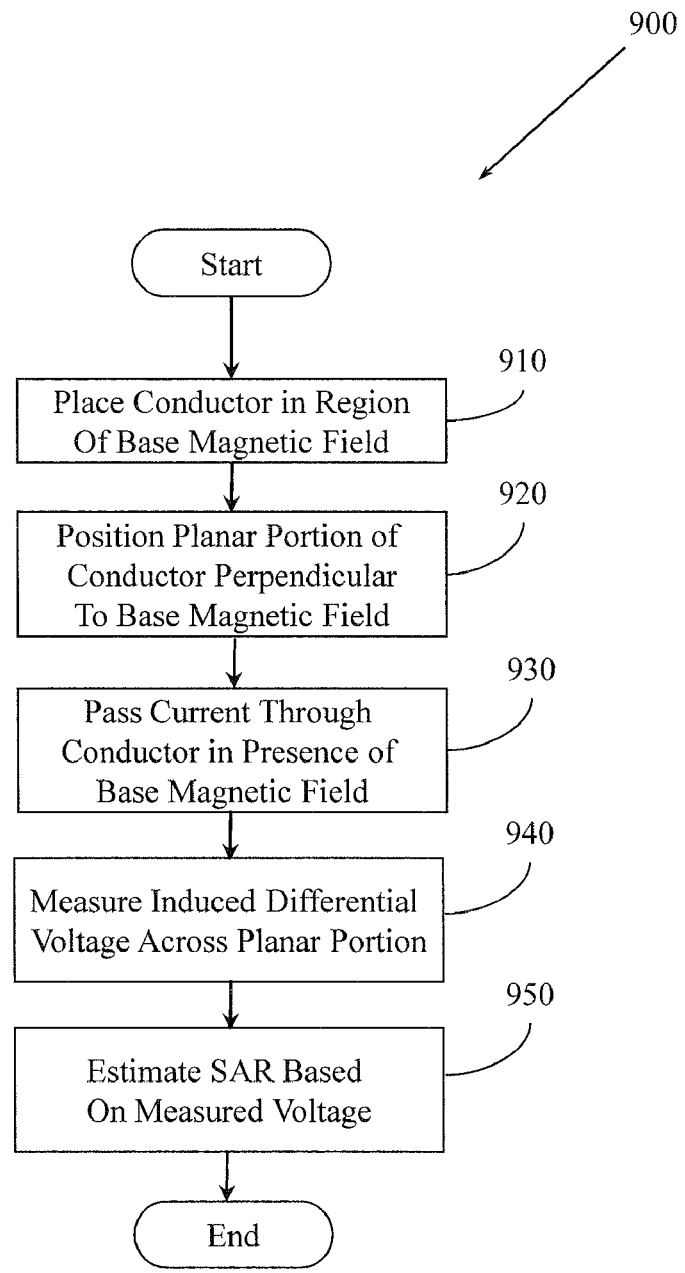
FIG. 9 illustrates a method associated with a Hall effect current sensor.

FIG. 9 illustrates a method 900 for implementing a Hall effect current sensor. The method 900 includes, at 910, placing a conductor that includes a planar portion in a region that is within a base magnetic field of an MRI apparatus when the MRI apparatus is in use. At 920, the conductor is oriented relative to the MRI apparatus such that the planar portion is disposed substantially perpendicular to an orientation of the base magnetic field produced when the MRI apparatus is in use. At 930, a current is passed through the conductor in the presence of the base magnetic field. An induced differential voltage across the planar portion in a direction substantially perpendicular to the base field orientation is measured at 940. At 950, a local Specific Absorption Ratio (SAR) is estimated based, at least in part, on the measured differential voltage.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
    a conductor configured to define a current path for a current in the presence of a base magnetic field having a base field orientation and a base field strength; and
    a current sensor comprising a planar portion of the conductor having a substantially planar configuration and being oriented to be disposed substantially perpendicular to the base field orientation.

2. The apparatus of claim 1, where the planar portion of the conductor is disposed substantially perpendicular to the base orientation current, such that, in the presence of the base magnetic field, the current will be unevenly distributed across the planar portion to induce a differential voltage across the planar portion in a direction substantially perpendicular to the base field orientation that is proportional to the base field strength and the current.

3. The apparatus of claim 1, where the conductor is a transmit or receive coil in a magnetic resonance imaging (MRI) apparatus.

4. The apparatus of claim 3, where the conductor is an MRI transmit phased array coil comprising a thin strip of conductive material and where the planar portion is formed by bending a section of the thin strip to orient the section perpendicular to the orientation of the base field.

5. The apparatus of claim 1, comprising a voltage sensor configured to measure the induced differential voltage across the planar portion and produce a signal indicative of the measured voltage.

6. The apparatus of claim 1, comprising a feedback controller configured to input a signal indicative of the differential voltage and to adjust a current source producing the current based, at least in part, on the differential voltage.

7. An MRI apparatus, comprising:
   an MRI transmit coil configured to define a current path for a radio frequency (RF) magnetic field-inducing current in the presence of a base magnetic field having a base field orientation and a base field strength,
   the MRI transmit coil comprising a current sensor that includes a planar portion of the transmit coil having a substantially planar configuration and being oriented to be disposed substantially perpendicular to the base field orientation.

8. The MRI apparatus of claim 7, where the planar portion of the current sensor is disposed substantially perpendicular to the base magnetic field-inducing current, such that, in the presence of the base magnetic field, the magnetic field-inducing current will be unevenly distributed across the planar portion to induce a differential voltage across the planar portion in a direction substantially perpendicular to the base field orientation that is proportional to the base field strength and the magnetic field-inducing current.

9. The MRI apparatus of claim 8, where the MRI transmit coil is a phased array transmit coil configured for use with other phased array transmit coils in a parallel transmission MRI apparatus.

10. The MRI apparatus of claim 8, comprising a voltage sensor configured to sense the differential voltage and provide a signal indicative of the sensed differential voltage.

11. The apparatus of claim 8, comprising a feedback controller configured to input a signal indicative of the differential voltage and adjust an RF current source producing the magnetic field-inducing current based, at least in part, on the differential voltage.

12. A method, comprising:
   placing a conductor that includes a planar portion having a substantially planar configuration in a region that is within a base magnetic field of an MRI apparatus when the MRI apparatus is in use; and
   orienting the conductor relative to the MRI apparatus such that the planar portion is disposed substantially perpendicular to an orientation of the base magnetic field produced when the MRI apparatus is in use.

13. The method of claim 12, comprising:
   passing a current through the conductor in the presence of the base magnetic field; and
   measuring a differential voltage across the planar portion in a direction substantially perpendicular to the base field orientation.

14. The method of claim 13, comprising determining an amount of current flowing through the conductor based, at least in part, on the measured differential voltage.

15. The method of claim 13, comprising controlling the passing of the magnetic field-inducing current based, at least in part, on the measured differential voltage.

16. The method of claim 13, comprising estimating a local Specific Absorption Ratio (SAR) based, at least in part, on the measured differential voltage.

* * * * *